(12) United States Patent
Dupuie

(10) Patent No.: US 7,098,732 B2
(45) Date of Patent: Aug. 29, 2006

(54) MULTI-STAGE VARIABLE GAIN AMPLIFIER UTILIZING OVERLAPPING GAIN CURVES TO COMPENSATE FOR LOG-LINEAR ERRORS

(75) Inventor: Scott T. Dupuie, Lakeway, TX (US)

(73) Assignee: Silicon Laboratories Inc., Austin, TX (US)

(*) Notice: Subject to any disclaimer, the term of this patent is extended or adjusted under 35 U.S.C. 154(b) by 54 days.

(21) Appl. No.: 10/954,969

(22) Filed: Sep. 30, 2004

(65) Prior Publication Data

US 2006/0066397 A1 Mar. 30, 2006

(51) Int. Cl.
*H03G 5/16* (2006.01)
(52) U.S. Cl. .................. 330/133; 330/134; 330/279
(58) Field of Classification Search .............. 330/133, 330/134, 279
See application file for complete search history.

(56) References Cited

U.S. PATENT DOCUMENTS

| | | | |
|---|---|---|---|
| 3,614,571 A * | 10/1971 | Koch | 388/815 |
| 3,969,683 A | 7/1976 | Fabricius | 330/144 |
| 4,833,418 A * | 5/1989 | Quintus et al. | 330/9 |
| 5,298,868 A | 3/1994 | Nagano | 330/129 |
| 5,841,320 A | 11/1998 | Ichihara | 330/133 |
| 5,880,618 A * | 3/1999 | Koen | 327/351 |
| 5,900,781 A | 5/1999 | Igarashi et al. | 330/254 |
| 6,333,675 B1 * | 12/2001 | Saito | 330/133 |
| 6,525,606 B1 * | 2/2003 | Atkinson | 330/133 |
| 6,748,201 B1 * | 6/2004 | Black et al. | 455/240.1 |

* cited by examiner

*Primary Examiner*—Patricia Nguyen
(74) *Attorney, Agent, or Firm*—O'Keefe, Egan & Peterman, LLP

(57) ABSTRACT

A multi-stage variable gain amplifier is disclosed that utilizes overlapping gain curves to compensate for log-linear errors. Each gain stage is configured to approximate a log-linear response with a sinusoidal error term such that a portion of the curve has positive errors and a portion of the curve has negative errors. In operation, the control signal inputs for the gain stages are driven such that the gain curves overlap and positive errors in each stage are offset by negative errors in the adjacent stage. The resulting combined gain is a more log-linear response.

20 Claims, 4 Drawing Sheets

MULTI-STAGE VARIABLE GAIN AMPLIFIER UTILIZING OVERLAPPING GAIN CURVES TO COMPENSATE FOR LOG-LINEAR ERRORS

TECHNICAL FIELD OF THE INVENTION

This invention relates to variable gain amplifiers, and more particularly, this invention relates to multi-stage variable gain amplifiers.

BACKGROUND

A variable gain amplifier (VGA) is an amplifier that has a signal gain (Av) determined by a control input. VGAs are utilized in communication systems and other electronic systems where an input signal level varies over a wide dynamic range. The VGA is often embedded inside of an automatic gain control (AGC) feedback loop which attempts to maintain the output signal level nearly constant even though the level of the input signal varies over time. When operating in a feedback loop, a VGA with exponential gain control characteristics is usually desirable for its large dynamic control range, constant loop settling time independent of absolute gain, and the ability to use the control signal as a logarithmic received signal strength indicator. It is also typically important to minimize the variation in the gain slope over the control input range because this factor is an important one in AGC loop stability. The control input can be discrete and digital in nature, such as an N-bit binary word. In this case, accurate exponential gain control can be accomplished by switching in or out gain control elements. In situations where the gain control loop is continuous and analog in nature, then either a voltage or current can be used to control the gain. Achieving accurate exponential gain control for such continuous gain control loops, however, is not easily achieved with CMOS circuitry.

Some prior VGAs have attempted to solve this problem by providing multiple gain stages. A limited range of the gain response for each stage can be used that are more linear in nature with respect to a logarithmic scale or log-linear. By serially combining multiple gain stages and controlling them individually, these prior VGAs could achieve a gain response that more closely tracked an ideal log-linear response than if a single stage were utilized. However, these prior solutions are still attempting to fit as best possible a fundamentally non-log-linear gain response curve for each stage onto a desired log-linear response.

SUMMARY OF THE INVENTION

The present invention provides a multi-stage variable gain amplifier that utilizes overlapping gain curves to compensate for log-linear errors. Each gain stage is configured to approximate a log-linear response with a sinusoidal error term such that a portion of the curve has positive errors and a portion of the curve has negative errors. In operation, the control signal inputs for the gain stages are driven such that the gain curves overlap and positive errors in each stage are offset by negative errors in the adjacent stage. The resulting combined gain is a more log-linear response.

In one embodiment, the present invention is a multi-stage variable gain amplifier, including two or more serially connected gain stages where each gain stage has a gain response with a positive error portion and a negative error portion, where each gain stage has a control input signal that determines the gain response for the stage, and where each control input signal is configured to transition from a minimum value to a maximum value; and control circuitry configured to provide the control input signals to the gain stages such that positive error portions overlap with negative error portions. In a more detailed embodiment, the gain response for each stage is configured to approximate a linear response on a logarithmic scale with a sinusoidal error term. As described below, other features and variations can be implemented, if desired, and related methods can be utilized, as well.

In another embodiment, the present invention is a method for controlling a multi-stage variable gain amplifier to achieve improved linearity, including providing two or more serially connected gain stages where each gain stage has a gain response with a positive error portion and a negative error portion; and controlling the gain stages so that positive error portions overlap with negative error portions. In a more detailed embodiment, the gain response for each gain stage is configured to approximate a linear response on a logarithmic scale with a sinusoidal error term.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

Figure 1:
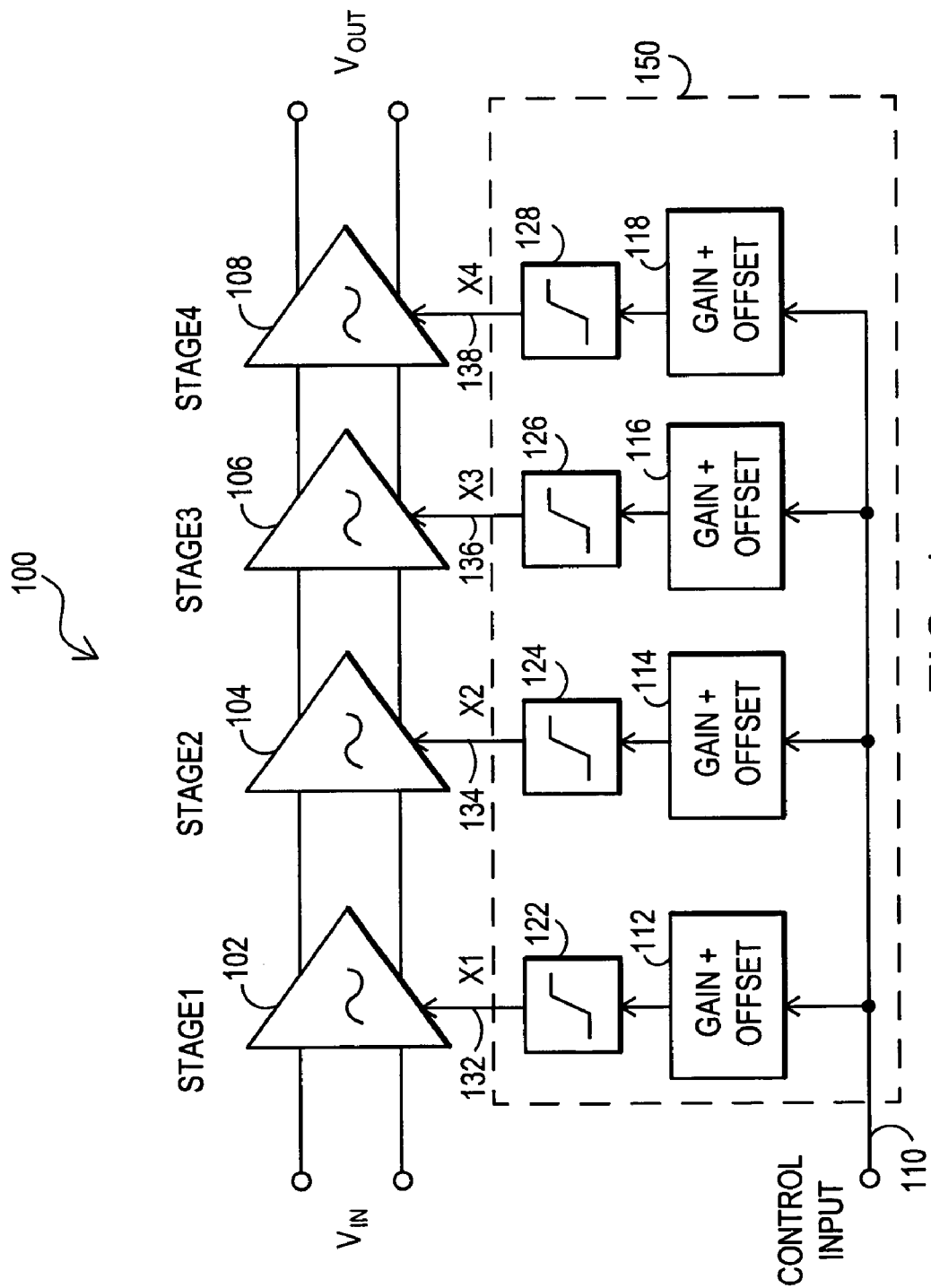
FIG. 1 is a block diagram for a multi-stage variable gain amplifier.
Figure 2A:
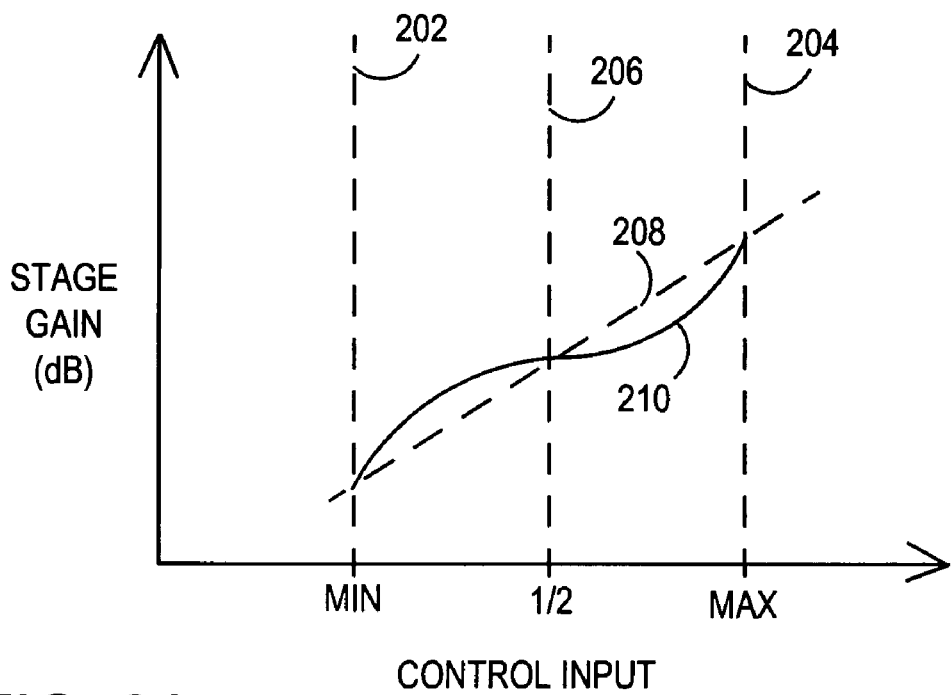
FIG. 2A is a diagram of a gain stage transfer function utilized for the stages of FIG. 1.
Figure 2B:
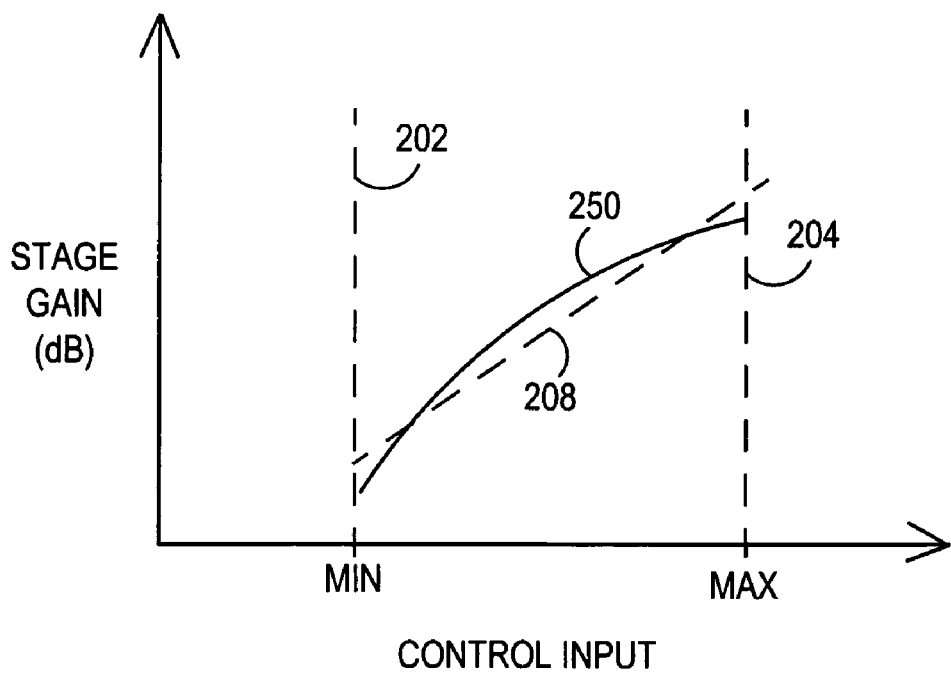
FIG. 2B (prior art) is a diagram of a gain stage transfer function utilized in prior art multi-stage systems.
Figure 3A:
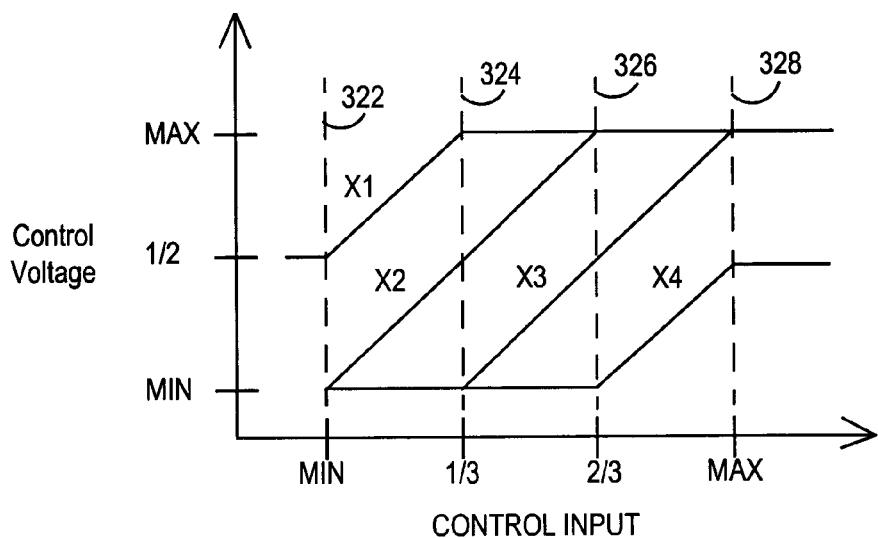
FIG. 3A is a diagram for control inputs for the stages of FIG. 1.
Figure 3B:
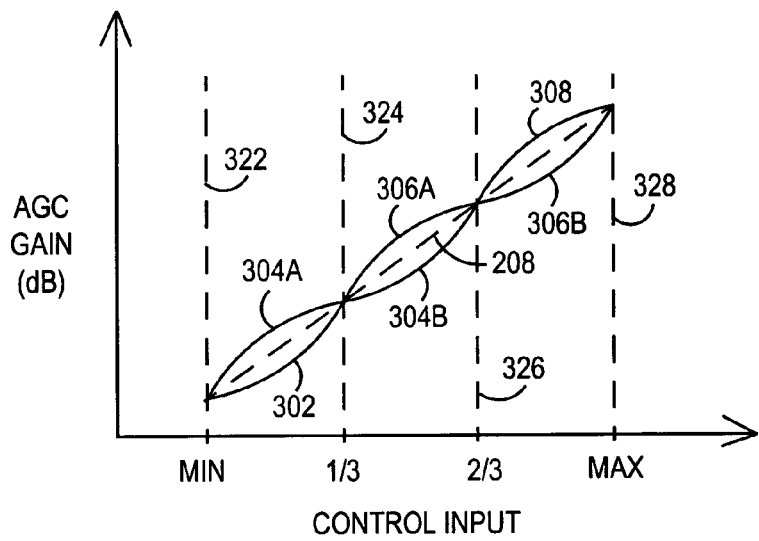
FIG. 3B is a diagram of the gain responses compared to an ideal log-linear response.
Figure 3C:
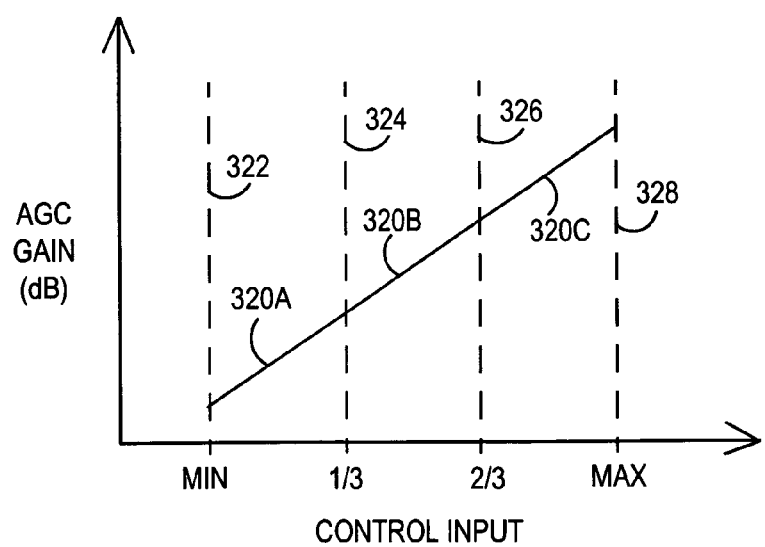
FIG. 3C is a diagram for the combined gain response for the multi-stage variable gain amplifier of FIG. 1 as controlled using the control inputs of FIG. 3A.
Figure 4:
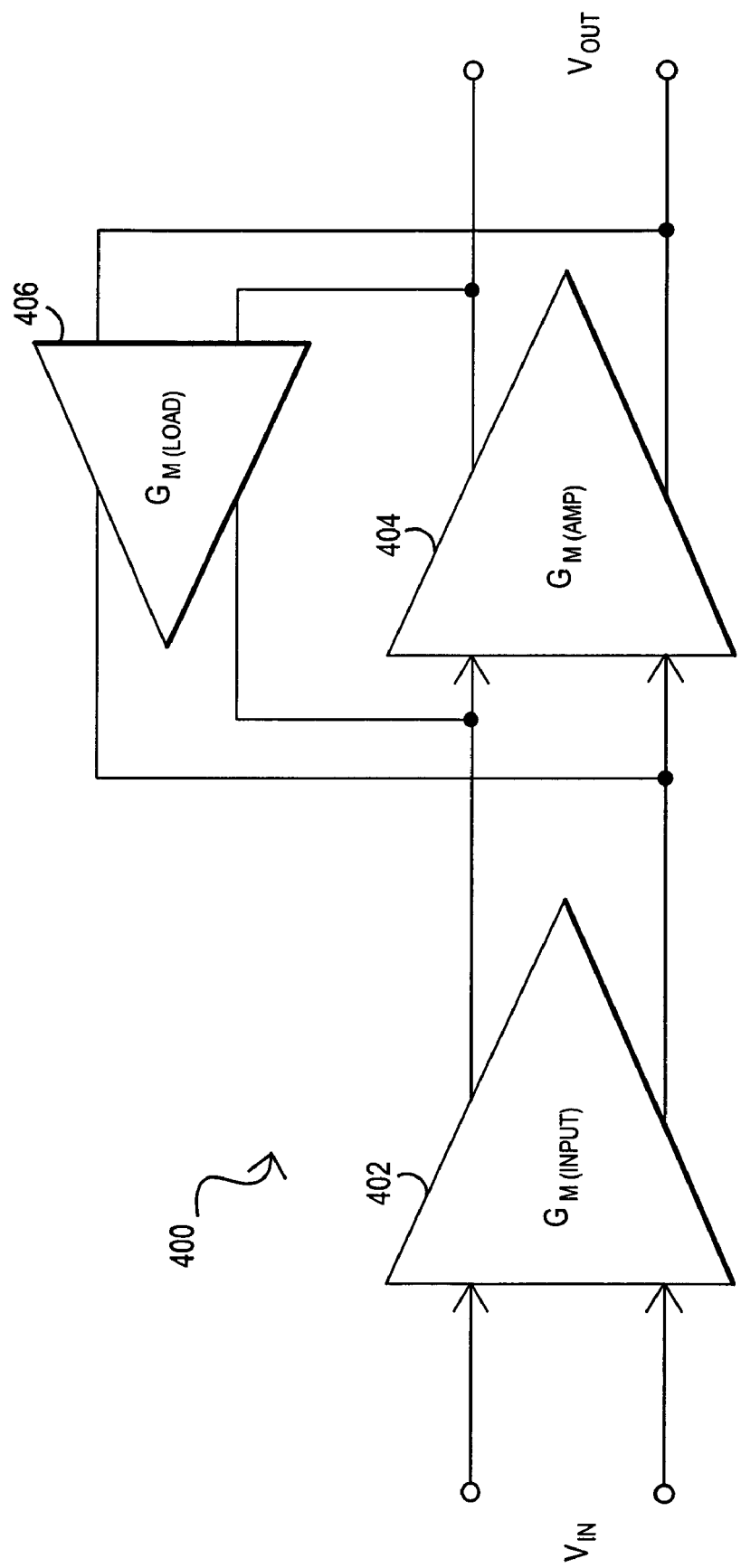
FIG. 4 is a block diagram of an embodiment for a gain stage for the multi-stage variable gain amplifier of FIG. 1.

The present invention provides a multi-stage variable gain amplifier (VGA) that utilizes overlapping gain curves to compensate for log-linear errors. FIG. 1 provides a diagram of the VGA. FIG. 2A and FIG. 2B (prior art) provide a comparison of gain curves utilized by the present invention and prior systems. FIGS. 3A–3C provide example control signals and resulting gain responses according to the present invention. And FIG. 4 provides an example embodiment for the gain stages.

FIG. 1 is a block diagram for a multi-stage variable gain amplifier. In particular, embodiment 100 includes gain stages 102, 104, 106 and 108. Each of these gain stages is designed to approximate a log-linear response with a sinusoidal error term. This gain stages are controlled by respective gain control input signals (X1, X2, X3, X4) 132, 134, 136 and 138. The gain stages 102, 104, 106 and 108 act together to provide an output voltage $V_{OUT}$ that is an amplified version of the input voltage $V_{IN}$. The gain control input signals (Xl, X2, X3, X4) 132, 134, 136 and 138 are generated from a control input 110 that is processed by control circuitry 150. In the embodiment depicted, control circuitry 150 includes gain/offset circuitry and limiter circuitry. In particular, for the control input signal (X1) 132 for STAGE1 102, the control signal 110 is passed through gain and offset circuitry 112 and then through limiter 122. For the control input signal (X2) 134 for STAGE2 104, the control signal 110 is passed through gain and offset circuitry 114 and then through limiter 124. For the control input signal (X3) 136 for STAGE3 106, the control signal 110 is passed through gain and offset circuitry 116 and then through limiter 126. And for the control input signal (X4) 138 for STAGE4 108, the control signal 110 is passed through gain and offset circuitry 118 and then through limiter 128. Ideally, the combined gain provided by the gains stages would be log-linear with respect to the control input 110.

Because an exponential function typically cannot be implemented using MOS devices in strong inversion directly, an exponential approximation is used in an effort to achieve a log-linear response. A suitable approximation that only requires linear math operations is given by:

$$e^{2x} \approx (1+x)/(1-x),$$

where $-1 \leq x \leq 1$. Each of the gain stages described in FIG. 1 is configured to have this exponential transfer function.

FIG. 2A is a diagram of gain stage transfer function utilized for the stages of FIG. 1 and shows a comparison between the approximation in the above equation and an ideal exponential transfer function for $-0.65 \leq x \leq 0.65$. (It is noted that outside of this range, the accuracy of the exponential approximation deteriorates rapidly.) The y-axis is logarithmic, which results in a straight line gain variation versus x for the ideal exponential case, and represents the stage gain in a logarithmic scale (dB), and the x-axis represents the control input signal. Line 210 represents the gain transfer function for each gain stage. Dotted line 202 represents the minimum value (MIN) for the control signal. Dotted line 204 represents the maximum value (MAX) for the control signal. And dotted line 206 represents a value half-way (½) between the MIN and MAX values. Dotted line 208 represents an ideal log-linear response for a gain stage. As seen in FIG. 2A, the actual gain 210 has a positive error with respect to the ideal response 208 when the control signal is between MIN and ½. And the actual gain 210 has a negative error with respect to the ideal response 208 when the control signal is between ½ and MAX. It is noted that the desired response is log-linear and that the approximation utilized includes a sinusoidal error term, such that portions can be considered to cross above and below the ideal response line 208.

FIG. 2B (prior art) is a diagram of a gain transfer function utilized in prior art multi-stage systems. As with FIG. 2A, the y-axis represents the stage gain in a logarithmic scale (dB), and the x-axis represents the control input signal. Dotted line 202 represents the minimum value (MIN) for the control signal, and dotted line 204 represents the maximum value (MAX) for the control signal. Dotted line 208 represents an ideal log-linear response for a gain stage. This response 250 is a simple curve that has been fitted to the ideal response line 208.

As discussed in further detail below with respect to FIGS. 3A–C, the present invention recognizes and utilizes the sinusoidal error term of the gain transfer response approximation, as shown in FIG. 2A, to achieve a more log-linear result when the gain stages 102, 104, 106 and 108 are combined in operation. In contrast, as shown in FIG. 2B, prior systems attempted to utilize a portion of the gain curve for each stage that was most log-linear. In particular, by utilizing error terms in the gain curves for the individual gain stages and overlapping them such that positive errors in one stage are offset by negative errors in another stage, the present invention achieves a more log-linear solution than provided by prior systems.

FIG. 3A is a diagram for control inputs X1, X2, X3 and X4 for the gain stages of FIG. 1. The y-axis represents the control voltage level from minimum (MIN) to maximum (MAX). In addition, levels for ½ of MAX−MIN for the control voltage level is also marked on the y-axis. The x-axis represents the level of the control input 110 from minimum (MIN) to maximum (MAX), which are indicated by dotted lines 322 and 328, respectively. In addition, levels for ⅓(MAX−MIN) and ⅔(MAX−MIN) for the control input 110 are also marked on the x-axis and are indicated by dotted lines 324 and 326, respectively. As shown in the embodiment depicted, the first stage control input signal X1 goes from ½ to MAX as the control input 110 goes from MIN to ⅓(MAX−MIN). The second stage control signal X2 goes from MIN to ½ as the control input 110 goes from MIN to ⅓(MAX−MIN), thereby overlapping the movement of control signal X1. And the second stage control signal X2 goes from ½ to MAX as the control input 110 goes from ⅓(MAX−MIN) to ⅔(MAX−MIN). The third stage control signal X3 goes from MIN to ½ as the control input 110 goes from ⅓(MAX−MIN) to ⅔(MAX−MIN), thereby overlapping the movement of control signal X2. And the third stage control signal X3 goes from ½ to MAX as the control input 110 goes from ⅔(MAX−MIN) to MAX. The fourth stage control signal X4 goes from MIN to ½ as the control input 110 goes from ⅔(MAX−MIN) to MAX, thereby overlapping the movement of control signal X3.

FIG. 3B is a diagram of the gain responses compared to an ideal log-linear response based upon the control input signals as depicted in FIG. 3A. The y-axis represents the AGC gain in a logarithmic scale (dB), and the x-axis again represents the level for control input 110. An ideal log-linear response is represented by dotted line 208. Segment 302 represents the gain provided by STAGE1 102 as it is controlled by the first control input signal (X1) 132. Segments 304A and 304B represent the gain provided by STAGE2 104 as it is controlled by the second control input signal (X2) 134. Segments 306A and 306B represent the gain provided by STAGE3 106 as it is controlled by the third control input signal (X3) 136. And segment 308 represents the gain provided by STAGE4 108 as it is controlled by the fourth control input signal (X4).

FIG. 3C is a diagram for the combined gain response 320 for the multi-stage variable gain amplifier of FIG. 1 as controlled using the control inputs of FIG. 3A. The y-axis represents the AGC gain in a logarithmic scale (dB), and the x-axis again represents the level for control input 110. As the control input 110 moves from MIN to ⅓(MAX−MIN), the gain 302 from STAGE1 and the gain 304A from STAGE2 combine such that the positive error in gain 304A is offset by the negative errors in gain 302. The resulting combined gain 320A is, therefore, close to a log-linear response. As the control input 110 moves from ⅓(MAX−MIN) to ⅔(MAX−MIN), the gain 304B from STAGE2 and the gain 306A from STAGE3 combine such that the positive error in gain 306A is offset by the negative errors in gain 304B. The resulting combined gain 320B is, therefore, close to a log-linear response. As the control input 110 moves from ⅔(MAX−MIN) to MAX, the gain 306B from STAGE3 and the gain 308 from STAGE4 combine such that the positive error in gain 308 is offset by the negative errors in gain 306B. The resulting combined gain 320C is, therefore, close to a log-linear response. Thus, by overlapping the sinusoidal errors in the gain curves for the individual gain stages to offset positive errors with negative errors, the present invention achieves a log-linear solution. It is noted that the log-linear errors in the gain curve of FIG. 2A are typically not symmetrical. Thus, in operation, residual errors will still likely occur in the resulting gain transfer function of FIG. 3C, where symmetry is not achieved. It is further noted that additional optimization of the log-linearity error or gain slope variation might be possible by adjusting the amount of overlap between the stages.

An additional advantage of segmenting the gain control is that the NF (noise figure) and IIP3 input 3rd order intercept point), as a function of gain, can be optimized for a given application. For example, the optimal IIP3 versus gain characteristic can often be achieved by cutting back the gain of the first stage, then the middle stage, and finally the last stage as the gain is reduced from maximum to minimum (STAGE1 ⇒STAGE2 ⇒STAGE3). Likewise, the optimal NF versus gain characteristic can often be achieved by cutting back the gain of the last stage, then the middle stage, and finally the first stage as the gain is reduced from maximum to minimum (STAGE3 ⇒STAGE2 ⇒STAGE 1). If NF and IIP3 are equally important, then either STAGE2 ⇒STAGE1 ⇒STAGE3 ordering or STAGE2 ⇒STAGE3 ⇒STAGE1 ordering will result in the best trade-off. The more stages there are in the VGA, the more opportunity there is to optimize the NF and IIP3 characteristics versus gain. Therefore, the series overlapping gain control technique of the present invention provides more flexibility in this respect because M+1 stages are used to achieve the desired overlap due to the use of only half of the range for the first and last gain stages. For example, with four stages, gain ordering of STAGE1⇒ STAGE2 ⇒STAGE3 ⇒STAGE4 can be chosen to optimize IIP3. Gain ordering of STAGE4 ⇒STAGE3⇒ STAGE2 ⇒STAGE1 can be chosen to optimize NF. And gain ordering of STAGE4 ⇒STAGE2⇒ STAGE1 ⇒STAGE3 to provide a high level of IIP3 performance while still having slightly improved NF performance. Thus, with the present invention, the gains for the stages can be configured to improve IIP3 performance, to improve NF performance, or to achieve some improvement to both.

FIG. 4 is a block diagram of an example embodiment 400 for the gain stages 102, 104, 106 and 108 of FIG. 1. In particular, a differential transconductance input stage $G_{M(INPUT)}$ 402 receives the differential input voltage $V_{IN}$ and provides a differential output to a transconductance amplifier stage $G_{M(AMP)}$ 404. A transconductance load stage $G_{M(LOAD)}$ 406 is connected in a feedback loop around the transconductance amplifier stage $G_{M(AMP)}$ 404. And the transconductance amplifier stage $G_{M(AMP)}$ 404 provides the differential output voltage $V_{OUT}$ for the stage. In operation, the gain of this stage circuitry 400 can be represented by $A_V = G_{M(INPUT)}/G_{M(LOAD)}$. And the bandwidth of the stage circuitry 400 can be represented by $BW = G_{M(AMP)}/C_{(LOAD)}$, wherein $C_{(LOAD)}$ represents the capacitance of the $G_{M(LOAD)}$ 406. Advantageously, with this circuitry 400, the bandwidth of the stage is independent of the gain of the stage, and the gain $A_V$ is insensitive to output resistance.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A multi-stage variable gain amplifier, comprising:

two or more serially connected gain stages, each gain stage having a gain response with a positive portion and a negative portion with respect to a desired gain level, each gain stage having a control input signal that determines the gain response for the stage, and each control input signal being configured to transition from a minimum value to a maximum value, the serially connected gain stages together forming a combined variable gain amplifier; and control circuitry configured to provide the control input signals to the gain stages such that a positive portion of one of the serially connected gain stages overlaps with a negative portion of another of the serially connected gain stages to produce a combined gain at the desired gain level, the control input signals for the gain stages being generated from a gain control signal for the combined variable gain amplifier.

2. The multi-stage variable gain amplifier of claim 1, wherein the gain response for each stage is configured to approximate a linear response on a logarithmic scale with a sinusoidal term.

3. The multi-stage variable gain amplifier of claim 2, wherein the control input signals for the first and the last stages are controlled such that only half the gain response for the first and last stages are utilized.

4. The multi-stage variable gain amplifier of claim 3, wherein the number of gain stages is four.

5. The multi-stage variable gain amplifier of claim 1, wherein control circuitry comprises a control input coupled to gain/offset circuitry and limiter circuitry to produce the control input signals for the gain stages.

6. The multi-stage variable gain amplifier of claim 5, wherein each gain stage has gain/offset circuitry coupled to the control input and a limiter coupled to receive the output of the gain/offset circuitry and to output the control input signal for the stage.

7. The multi-stage variable gain amplifier of claim 1, wherein two or more gains for the gain stages are configured to be different.

8. The multi-stage variable gain amplifier of claim 7, wherein the gains for gain stages are configured to improve IIP3 performance.

9. The multi-stage variable gain amplifier of claim 8, wherein the gains for gain stages are configured to improve noise figure performance.

10. The multi-stage variable gain amplifier of claim 1, wherein each successive control input signal is configured to transition from its minimum value to its maximum value when the previous control input signal is about half-way from its minimum value to its maximum value.

11. A method for controlling a multi-stage variable gain amplifier to achieve improved linearity, comprising:

providing two or more serially connected gain stages, each gain stage having a gain response with a positive portion and a negative portion with respect to a desired gain level, the serially connected gain stages together forming a combined variable gain amplifier;

controlling the gain stages so that a positive portion of one of the serially connected gain stages overlaps with a negative portion of another of the serially connected gain stages to produce a combined gain at the desired gain level; and receiving a gain control input for the combined variable gain amplifier from which the control input signals for the gain stages are generated.

12. The method of claim 11, wherein the gain response for each gain stage is configured to approximate a linear response on a logarithmic scale with a sinusoidal term.

13. The method of claim 12, wherein the controlling step comprises controlling the control input signals for the first and the last stages such that only half the gain response for the first and last stages are utilized.

14. The method of claim 13, wherein the number of gain stages is four.

15. The method of claim 11, further comprising a applying the control input to gain/offset circuitry and limiter circuitry to generate the control input signals for the gain stages.

16. The method of claim 15, wherein for each gain stage, the control input is passed through gain/offset circuitry and then through a limiter to produce the control input signal for the stage.

17. The method of claim 11, wherein two or more gains for the gain stages are configured to be different.

18. The method of claim 17, wherein the gains for gain stages are configured to improve IIP3 performance.

19. The method of claim 18, wherein the gains for gain stages are configured to improve noise figure performance.

20. The method of claim 11, further comprising transitioning each successive control input signal from its minimum value to its maximum value when the previous control input signal is about half-way from its minimum value to its maximum value.

* * * * *